(12) United States Patent
Ryu

(10) Patent No.: US 10,934,446 B2
(45) Date of Patent: Mar. 2, 2021

(54) INK REINFORCEMENT FOR PRINTED ELECTRONICS

(71) Applicant: Indiana University Research and Technology Corporation, Indianapolis, IN (US)

(72) Inventor: Jong Eun Ryu, Carmel, IN (US)

(73) Assignee: Indiana University Research and Technology Corporation, Indianapolis, IN (US)

( * ) Notice: Subject to any disclaimer, the term of this patent is extended or adjusted under 35 U.S.C. 154(b) by 0 days.

(21) Appl. No.: 15/776,675

(22) PCT Filed: Nov. 22, 2016

(86) PCT No.: PCT/US2016/063344
§ 371 (c)(1),
(2) Date: May 16, 2018

(87) PCT Pub. No.: WO2017/091581
PCT Pub. Date: Jun. 1, 2017

(65) Prior Publication Data
US 2018/0371277 A1 Dec. 27, 2018

Related U.S. Application Data

(60) Provisional application No. 62/258,725, filed on Nov. 23, 2015.

(51) Int. Cl.
*C09D 11/52* (2014.01)
*C09D 11/037* (2014.01)
(Continued)

(52) U.S. Cl.
CPC .......... *C09D 11/52* (2013.01); *B41M 5/0023* (2013.01); *B82Y 30/00* (2013.01); *C09D 11/037* (2013.01);
(Continued)

(58) Field of Classification Search
CPC ... B41J 2/01; B41J 2/211; B41J 2/1433; B41J 2/17; B41J 2/17593; B41J 2/2107;
(Continued)

(56) References Cited

U.S. PATENT DOCUMENTS 8,062,697 B2 * 11/2011 Yaniv ...................... C01B 32/15
427/197
2005/0089679 A1 * 4/2005 Ittel ........................... D01F 1/10
428/323

(Continued)

OTHER PUBLICATIONS

International Search Report and Written Opinion issued by the ISA/US, Commissioner for Patents, dated Feb. 16, 2017, for International Application No. PCT/US2016/063344; 8 pages.
(Continued)

*Primary Examiner* — Manish S Shah
(74) *Attorney, Agent, or Firm* — Faegre Drinker Biddle & Reath LLP

(57) ABSTRACT

Reinforced conductive nanoink formulations are disclosed including a carrier, metallic nanostructures dispersed in the carrier, and a reinforcement fiber. Methods of depositing and manufacturing using reinforced nanoinks are also disclosed.

21 Claims, 3 Drawing Sheets

(51) Int. Cl.
*B41M 5/00* (2006.01)
*C09D 11/322* (2014.01)
*H05K 1/09* (2006.01)
*B82Y 30/00* (2011.01)
*C09D 11/10* (2014.01)
*C09D 11/54* (2014.01)
*H05K 3/12* (2006.01)

(52) U.S. Cl.
CPC ............ *C09D 11/10* (2013.01); *C09D 11/322* (2013.01); *C09D 11/54* (2013.01); *H05K 1/097* (2013.01); *H05K 3/1283* (2013.01); *H05K 2201/026* (2013.01); *H05K 2201/0257* (2013.01); *H05K 2201/0281* (2013.01); *H05K 2203/1131* (2013.01)

(58) Field of Classification Search
CPC ...... B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 11/0015; B41J 11/002; B41J 2/161; B41J 2/1623; B41J 2202/00; B41J 2202/03; B41J 2/14201; B41J 2/045; C09D 11/36; C09D 11/40; C09D 11/30; C09D 11/38; C09D 11/32; C09D 11/322; C09D 11/324; C09D 11/328; C09D 11/101; C09D 11/102; C09D 11/005; C09D 11/54; C09D 11/52; B41M 5/0011; B41M 5/0017; B41M 5/0047; B41M 7/00; B41M 7/0072; B41M 5/52; B41M 5/5218

See application file for complete search history.

(56) References Cited

U.S. PATENT DOCUMENTS

| | | | |
|---|---|---|---|
| 2006/0159838 A1* | 7/2006 | Kowalski | B82Y 30/00 427/58 |
| 2008/0250972 A1* | 10/2008 | Oldenzijl | C09D 11/101 106/31.92 |
| 2009/0072013 A1 | 3/2009 | Natekar et al. | |
| 2010/0119789 A1 | 5/2010 | Grande | |
| 2011/0048772 A1* | 3/2011 | Han | C09D 11/52 427/98.4 |
| 2011/0198542 A1 | 8/2011 | Chung et al. | |
| 2012/0111599 A1 | 5/2012 | Roberson et al. | |

OTHER PUBLICATIONS

Joo et al., "A Highly Reliable Copper Nanowire/Nanoparticle Ink Pattern with High Conductivity on Flexible Substrate Prepared via a Flash Light-Sintering Technique" ACS Applied Materials & Interfaces, vol. 7, Issue 10, Feb. 25, 2015; 11 pages.

Kim et al., "Reinforcement of Cu nanoink sintered film with extended carbon nanofibers for large deformation of printed electronics," Journal of Composite Materials, Jul. 8, 2016; 7 pages.

* cited by examiner

INK REINFORCEMENT FOR PRINTED ELECTRONICS

CROSS-REFERENCE TO RELATED APPLICATIONS

This application is a U.S. National Stage Application under 35 U.S.C. § 371 of International Patent Application No. PCT/US2016/063344, filed Nov. 22, 2016, which claims the benefit of and priority to U.S. Provisional Patent Application No. 62/258,725, entitled INK REINFORCEMENT FOR PRINTED ELECTRONICS, filed on Nov. 23, 2015, the entire disclosures of which are hereby expressly incorporated by reference in their entireties.

FIELD OF DISCLOSURE

This disclosure relates to nanoinks comprising nanoparticles or nanowires capable of forming conductive patterns and methods of depositing such inks. More specifically, this disclosure relates to nanoinks comprising nanoparticles or nanowires capable of forming conductive patterns when printed.

BACKGROUND

Conductive nanoinks are inks that, when printed, can result in a printed object (e.g., a circuit) that conducts electricity. Thus, conductive inks typically contain conductive materials, such as metallic flakes, metallic powders, or conductive polymers that facilitate the flow of electricity. Often the inks are in liquid suspensions or solutions and, thus, may be dried, cured and/or incorporate melting processes into the printing.

Due to the additive nature of printed conductive inks, conductive inks can have certain advantages over conventional systems (e.g., etching) and may in certain implementations be more economical, more environmental friendly, and reduce processes and manufacture times.

Moreover, printed conductive inks may often be printed on a variety of substrates and, thus, may be used for a variety of uses like radio-frequency identification (RFID) tags, admission tickets, wearable electronics, Internet of Things (IoT), human or soldier performance monitors and sensors, implantable medical devices, vehicle structural sensors, 3-dimensional printed electronics, touch screens, diodes, capacitors (e.g., embedded capacitors), resistors, and photovoltaic cells.

However, current conventional nanoinks tend to build residual stress during the drying, curing, or melting process. In various situations, this residual stress can cause delamination between the substrate and printed patterns, cracks within printed patterns, and weaken the product's long-term resistance to fatigue.

Furthermore, the residual stress may also lead to small or nanoscale cracks that can lead to crack propagation, which may also significantly reduce the lifespan and reliability of systems with printed conductive inks.

In order to prevent the crack growth and propagation, various approaches have been investigated including (1) reinforcing sintered films with 1-dimensional (1D) nanomaterials such as carbon nanotubes (CNTs), Ag and Cu nanowires (NWs) and (2) controlling of microstructure of sintered NP films by thermal annealing. Although those research using 1D reinforced composite materials demonstrated improved elastic modulus and fatigue resistance, typical length of CNTs and NWs (sub 10 μm) are not sufficiently long to prevent cracks and to bridge the gaps, resulting from severe mechanical deformation of flexible electronics under various operation conditions.

A need therefore exists to address issues of residual tensile stress and crack propagation with conventional conductive nanoinks.

SUMMARY

Accordingly, this disclosure includes various conductive inks, systems, and methods for reducing the residual stress and crack propagation of conductive nanoinks. Thus, various products made with the various conductive inks or methods disclosed herein may reduce both electrical and mechanical failure of such products.

Reinforced ink formulations may include a carrier, metallic nanostructures dispersed in the carrier, and a reinforcement fiber.

Methods of depositing may include depositing an ink formulation comprising a carrier and metallic nanostructures dispersed in the carrier on a substrate, and depositing a reinforcement fiber in the ink formulation.

BRIEF DESCRIPTION OF THE DRAWINGS

The above mentioned and other features and objects of this disclosure, and the manner of attaining them, will become more apparent and the disclosure itself will be better understood by reference to the following description of an embodiment of the disclosure taken in conjunction with the accompanying drawings, wherein.

Figure 1:
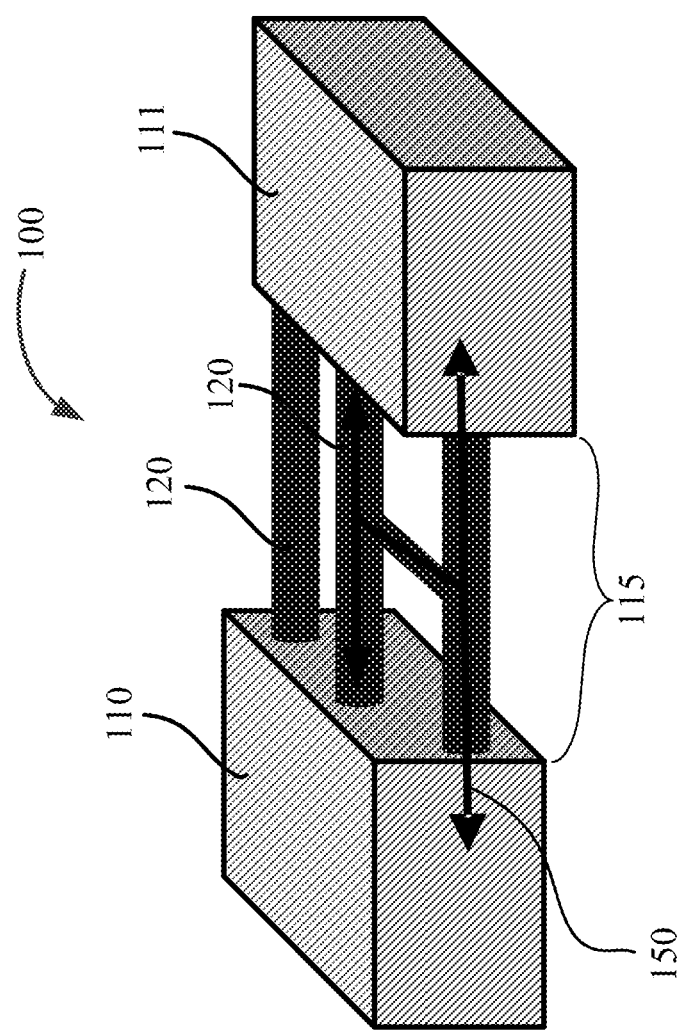
FIG. 1 is an illustration of a deposited printed ink according to various embodiments.

Corresponding reference characters indicate corresponding parts throughout the several views. Although the drawings represent embodiments of the present disclosure, the drawings are not necessarily to scale and certain features may be exaggerated in order to better illustrate and explain the present disclosure. The exemplification set out herein illustrates an embodiment of the disclosure, in one form, and such exemplifications are not to be construed as limiting the scope of the disclosure in any manner.

DETAILED DESCRIPTION

The embodiments disclosed below are not intended to be exhaustive or limit the disclosure to the precise form disclosed in the following detailed description. Rather, the embodiments are chosen and described so that others skilled in the art may utilize its teachings.

As used herein, the modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

Various reinforced ink formulations disclosed herein may comprise a carrier, metallic nanostructures dispersed in the carrier, and a reinforcement fiber. One or more types of reinforcement fibers may be used within the reinforced ink formulation and may improve the electrical conductivity and/or mechanical strength of deposited reinforced ink formulations.

Thus, in various embodiments, a dimension of the reinforcement fiber may have an average size that is larger than an average crack propagation of the ink when affixed (e.g., dried or sintered). For example, if the average crack propagation of an ink is 15 nm when sintered, one dimension of the reinforcement fiber may be larger than 15 nm, thus reinforcing the deposited ink formulation electronically and/ or mechanically.

Thus, the reinforcement fiber may vary in size, for example, from wherein a dimension of the reinforcement fiber has an average size between about 11 nm and about 200 µm, from about 25 nm to about 20 µm, from about 30 nm to about 1 µm, from about 32 nm to about 500 nm, or from about 50 nm to about 250 nm. According to various embodiments, reinforced the nanoink sintered film may utilized very long carbon nanofiber (CNF). The CNF may extend from lengths of about 200 µm or less with a unique morphology in that concentric cup-shaped graphenes are stacked along the axis, which is also referred to Stacked-Cup Carbon Nanotubes (SCCNTs).

Also, the reinforcement fiber may be a variety of reinforcement fibers. Suitable reinforcement fibers include electronically conductive microfibers, nanotubes, nanoparticles, nanospheres, nanocrystals, nanowires, nanoflakes, nanoshells, nanorings, nanocages, nanorods, quantum dots, or combinations thereof.

Suitable reinforcement fibers may conduct electricity and may have an electrical conductivity between about 10,000 and 100,000,000 S/m, between about 100,000 and 50,000,000 S/m, and between about 100,000 and 10,000,000 S/m. As used herein, all properties, such as electrical conductivity, are measured at 293 K, unless indicated otherwise.

Also, suitable reinforcement fibers may have a tensile strength sufficient to reinforce the deposited ink formulation after sintering and may have a tensile strength between about 3,000 and 75,000 MPa, between about 10,000 and 65,000 MPa, and between about 11,000 and 63,000 MPa.

The metallic nanostructure may include various types of metallic nanoparticles. Various exemplary metallic nanoparticles include silver, aluminum, gold, copper, nickel, zirconium, niobium, iron, tin, zinc, titanium, hafnium, tantalum, platinum, palladium, chromium, vanadium, gallium, lead, iridium, cadmium, tungsten, molybdenum, alloys thereof, oxides thereof, or combinations thereof.

The carrier may be present in an amount sufficient to disperse the metallic nanoparticles and facilitate various adjustments to the viscosity of the ink formulation. Carriers may also be selected to dissolve various polymers that may be present in selected ink formulations. Suitable carriers include water, organic solvents, and combinations thereof.

Suitable organic solvents include mono-, di-, or tri-ethylene glycols or higher ethylene glycols, propylene glycol, 1,4-butanediol or ethers of such glycols, thiodiglycol, glycerol and ethers and esters thereof, polyglycerol, mono-, di-, and tri-ethanolamine, propanolamine, N,N-dimethylformamide, dimethyl sulfoxide, dimethylacetamide, methanol, ethanol, isopropanol, n-propanol, diacetone alcohol, acetone, methyl ethyl ketone (MEK), propylene carbonates, N-methylpyrrolidone, 1,3-dimethylimidazolidone, and combinations thereof.

While the amount of CNF is not particularly limited, various embodiments may include between about 0.1% to about 10% CNF by weight to the metallic nanoparticles, between about 0.3% to about 2% CNF by weight to the metallic nanoparticles, or from about 0.5% to about 1% CNF by weight to the metallic nanoparticles.

Furthermore, various ink formulations may also comprise a polymer. In various embodiments, the polymer may be conductive and may help assist electron transport throughout deposited ink formulations. Conventional carriers may be used in reinforced printed ink formulations, such as polymers. Suitable polymers include poly(3,4-ethylenedioxythiophene)/poly(styrene sulfonate), polyaniline, polypyrrole, polyvinyl alcohol, poly(N-vinylpyrrolidone), and combinations thereof.

Various reinforced ink formulations may contain one or more optional additives such as, for example, colorants (e.g. dyes and/or pigments), surfactants, thickeners, and combinations thereof.

In various embodiments, there may be no current flow across the printed Cu nanoink before sintering due to high contact resistance between nanoparticles. After photonic sintering with Xe flash light, the resistivity of Cu nanoink film in various embodiments turned into 882.8 µΩ·cm. It should be noted that the methods and systems disclosed herein are not particularly limited to only one set of sintering parameters. Accordingly, one of skill in the art with the benefit of this disclosure may adjust sintering parameters including the number of flash, flash duration, flash gap, and/or intensity to achieve various results. For example, samples herein were sintered at a condition of 20 J 20 ms of Xe flash.

The resistivity of a 0.5% CNF mixed Cu film was measured to be 212.7 µΩ·cm. The resistance of pure Cu nanoink film increased by 35.35%, 79.99%, and 144.44% under the bending radiuses of 7.5 cm, 5 cm, and 2.5 cm, respectively, while the incensement in 0.7% CNF added Cu nanoink film were 3.50%, 30.01%, and 56.20%.

In one embodiment, Cu nanoink was prepared by dissolved 0.3 g of poly(N-vinylpyrrolidone) (PVP) in 2 g of diethylene glycol (DEG, >99.0%) with ultrasonication, at a frequency of 40 KHz. The solution was then mixed with 1.9 g of oxidized copper (CuO) nanoparticles and 8 ml of 2-(2-butoxyethoxy) ethanol in an ultrasonic bath.

FIG. 1 illustrates an electronically conductive network 100 according to various embodiments. Electronically conductive network 100 may be formed from a deposited reinforced ink formulation comprising a carrier, metallic nanostructures dispersed in the carrier, and a reinforcement fiber, as described above. When deposited and dried, sintered, or polymerized, the metallic nanostructures may form electronically conductive mass 110 and electronically conductive mass 111. In various embodiments, electronically conductive mass 110 and electronically conductive mass 111 may be formed from a deposited pattern, for example, prior to sintering.

Due to physical gap 115 between electronically conductive mass 110 and electronically conductive mass 111, reinforcement fibers 120 may be provided. Reinforcement fibers 120 may mechanically reinforce or establish a mechanical coupling of electronically conductive mass 110 and electronically conductive mass 111.

Furthermore, reinforcement fibers 120 may also electronically reinforce or establish electronically conductive pathways between electronically conductive mass 110 and electronically conductive mass 111. The electronically conductive pathways may allow electrical current 150 to pass through and between electronically conductive mass 110 and electronically conductive mass 111.

Figure 2:
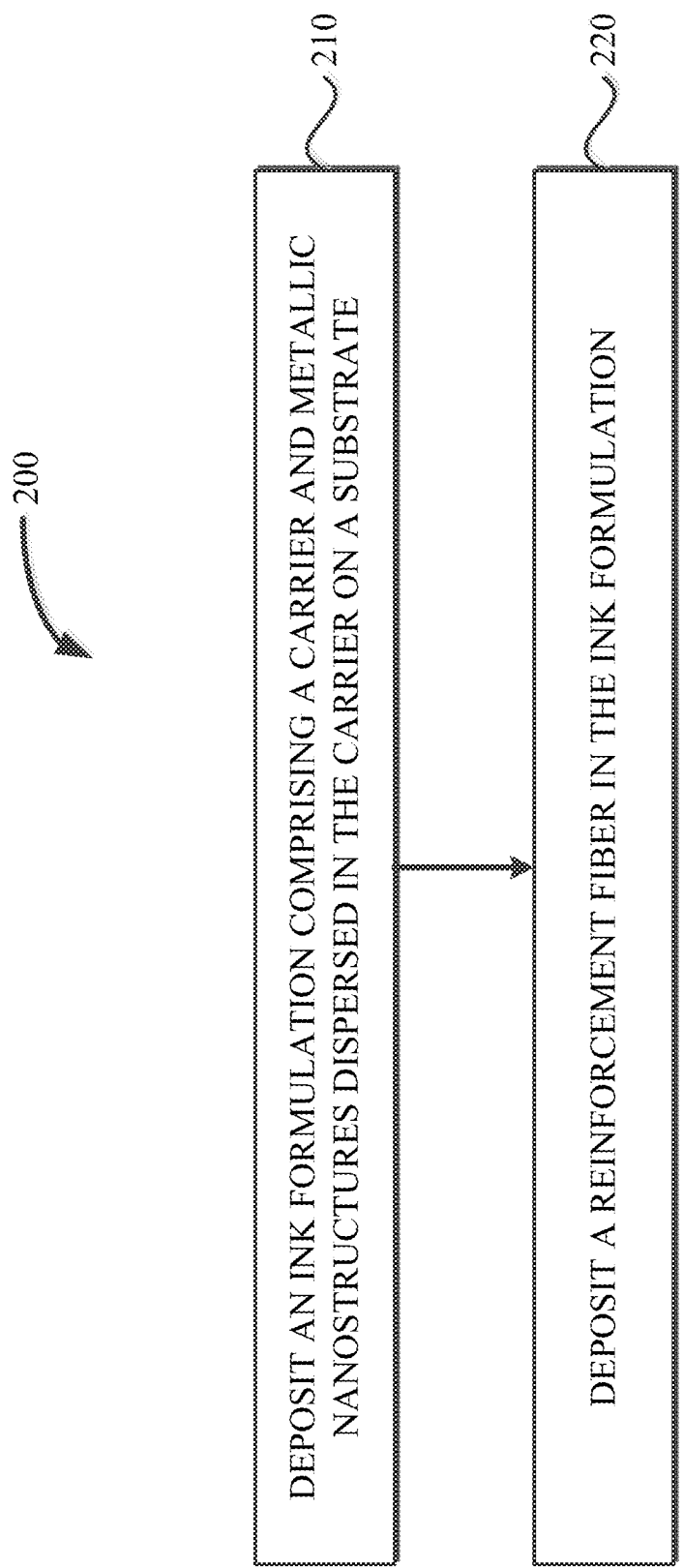
FIG. 2 illustrates a method of depositing conductive nanoinks according to various embodiments.
Figure 3:
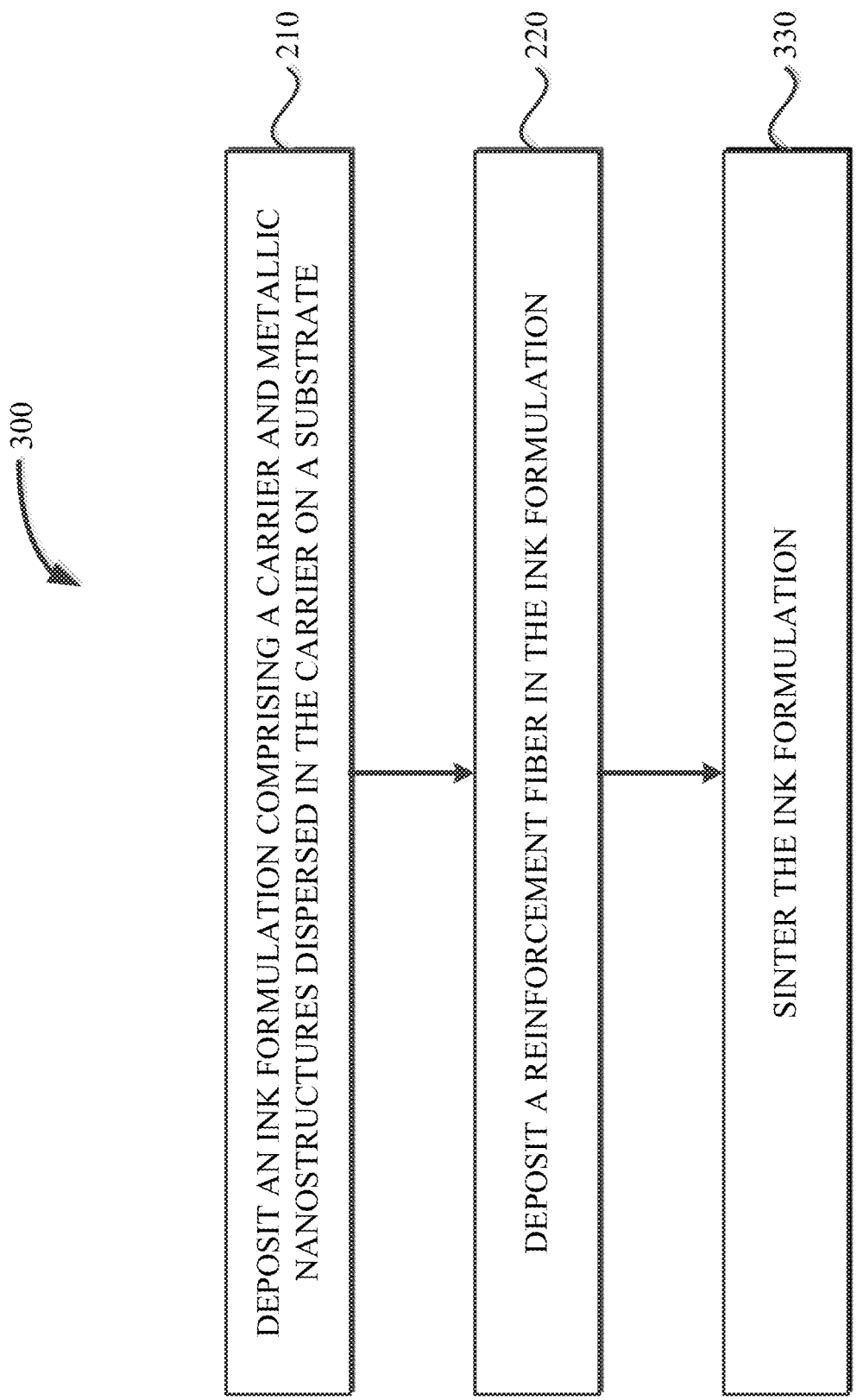
FIG. 3 illustrates a method of manufacture according to various embodiments.

Electronically conductive network 100 may be formed, for example, by methods 200 and 300 disclosed in FIG. 2 and FIG. 3 respectively. Methods 200 and 300 illustrate methods of depositing an ink formulation comprising a carrier and metallic nanostructures dispersed in the carrier on a substrate (step 210) and depositing a reinforcement fiber in the ink formulation (step 220).

The order of step 210 and step 220 is not particularly limited. Thus, for example, the depositing of the reinforcement fiber may be done before, during, or after the depositing of the ink formulation or the depositing of the reinforcement fiber is done simultaneously with the depositing of the ink formulation. Thus, in various embodiments, the reinforcement fiber may be evenly dispersed in the carrier (e.g., for simultaneous deposition of the carrier, conductive nanostructure, and reinforcement fibers).

Moreover, the methods of depositing an ink formulation comprising a carrier and metallic nanostructures dispersed in the carrier on a substrate are not particularly limited. For example, the depositing of the ink formulation includes printing the ink formulation.

Various methods of printing may be used and may include, for example, methods comprising screen printing, inkjet printing, laser printing, gravure printing, xerographic printing, pad printing, dip pen printing, syringe printing, airbrush printing, flexography, lithography, or combinations thereof.

Various methods of manufacture may also comprise forming a solid from the deposited ink formulation. Various methods of forming a solid include sintering, drying, or polymerizing. For example, method 300 may also comprise sintering the ink formulation (step 330) for example, to manufacture an electrically conductive article. Methods of sintering are not particularly limited and may include heating the deposited ink formulation in an oven and/or irradiating the deposited material with light. For example, Jonguen Ryu, et al., Reactive Sintering of Copper Nanoparticles Using Intense Pulsed Light For Printed Electronics, Journal of Electronic Materials, Vol. 40, No. 1, 2011 and J. S. Kang, et al., Inkjet Printed Electronics Using Copper Nanoparticle Ink, *Journal of Materials Science: Materials in Electronics*, Vol. 21, pp. 213-1220, 2010, both of which are expressly incorporated herein by reference, disclose various methods of sintering conductive nanoparticle inks.

Without being limited to any particular theory, it is believed that the deposition of reinforcement fibers prior to sintering may allow for improved electric conductivity of a deposited conductive ink after sintering has occurred. While some cracks may still be present in some embodiments, it is within the scope of this disclosure to include reinforcement fibers wherein a dimension of the reinforcement fiber has an average size that is larger than an average crack propagation of the ink when sintered. Thus, electrical communication and/or mechanical communication may be maintained when cracking of the sintered conductive ink occurs.

Accordingly, methods disclosed herein include methods where the depositing of the reinforcement fiber (step 220) creates an electronically conductive bridge between a gap of the deposited metallic nanostructures, creates a mechanical interlock between a gap of the deposited metallic nanostructures, or creates both.

Thus, as mentioned above, the reinforcement fiber may vary in size, for example, from wherein a dimension of the reinforcement fiber has an average size between about 11 nm and about 200 µm, from about 25 nm to about 20 µm, from about 30 nm to about 1 µm, from about 32 nm to about 500 nm, or from about 50 nm to about 250 nm.

While this disclosure has been described as having exemplary designs, the present disclosure may be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this disclosure pertains.

It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B or C may be present in a single embodiment; for example, A and B, A and C, B and C, or A and B and C. Different cross-hatching is used throughout the figures to denote different parts but not necessarily to denote the same or different materials.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art with the benefit of this disclosure to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112 (f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A reinforced ink formulation deposited on a substrate, the formulation comprising:
    a first mass of metallic nanostructures dispersed in a carrier;
    a second mass of metallic nanostructures dispersed in the carrier; and
    a reinforcement fiber located in a gap between the first and second masses of metallic nanostructures and forming at least one of an electronically conductive bridge and a mechanical interlock between the first and second masses of metallic nanostructures.

2. The reinforced ink formulation of claim 1, wherein the reinforcement fiber has an electrical conductivity between about 10,000 and 100,000,000 S/m at 293 K.

3. The reinforced ink formulation of claim 1, wherein the reinforcement fiber has tensile strength between about 3,000 and 75,000 MPa.

4. The reinforced ink formulation of claim 1, wherein a dimension of the reinforcement fiber has an average size that is larger than an average crack propagation of the ink when sintered.

5. The reinforced ink formulation of claim 1, wherein a dimension of the reinforcement fiber has an average size between about 11 nm and about 200 μm.

6. The reinforced ink formulation of claim 1, wherein the reinforcement fiber comprises electronically conductive microfibers, nanotubes, nanoparticles, nanospheres, nanocrystals, nanowires, nanoflakes, nanoshells, nanorings, nanocages, nanorods, quantum dots, or combinations thereof.

7. The reinforced ink formulation of claim 1 further comprising a polymer.

8. The reinforced ink formulation of claim 7, wherein the polymer comprises poly(3,4-ethylenedioxythiophene)/poly (styrene sulfonate), polyaniline, polypyrrole, polyvinyl alcohol, poly(N-vinylpyrrolidone), or combinations thereof.

9. The reinforced ink formulation of claim 1, wherein metallic nanoparticle comprises silver, aluminum, gold, copper, nickel, zirconium, niobium, iron, tin, zinc, titanium, hafnium, tantalum, platinum, palladium, chromium, vanadium, gallium, lead, iridium, cadmium, tungsten, molybdenum, alloys thereof, oxides thereof, or combinations thereof.

10. The reinforced ink formulation of claim 1, wherein the reinforcement fiber is dispersed in the carrier.

11. A method of depositing comprising:
depositing an ink formulation comprising a carrier and metallic nanostructures dispersed in the carrier on a substrate; and
depositing a reinforcement fiber in the ink formulation, wherein the depositing of the reinforcement fiber creates at least one of an electronically conductive bridge and a mechanical interlock between a gap of the deposited metallic nanostructures and is performed before or after the depositing of the ink formulation.

12. The method of claim 11, the reinforcement fiber has an electrical conductivity between about 10,000 and 100,000,000 S/m at 293 K.

13. The method of claim 11, wherein the depositing of the ink formulation includes printing.

14. The method of claim 13, wherein the printing is screen printing, inkjet printing, laser printing, gravure printing, xerographic printing, pad printing, dip pen printing, syringe printing, airbrush printing, flexography, lithography, or combinations thereof.

15. A method of manufacturing comprising:
depositing a pattern on a substrate according to the method of claim 11; and
sintering the ink formulation.

16. The method according to claim 11 further comprising irradiating the deposited material with light.

17. The method according to claim 11, wherein a dimension of the reinforcement fiber has an average size that is larger than an average crack propagation of the ink when sintered.

18. The method according to claim 11, wherein a dimension of the reinforcement fiber has an average size between about 11 nm and about 200 μm.

19. The method according to claim 11, wherein the depositing of the reinforcement fiber creates an electronically conductive bridge between a gap of the deposited metallic nanostructures.

20. The method according to claim 11, wherein the depositing of the reinforcement fiber creates a mechanical interlock between a gap of the deposited metallic nanostructures.

21. A method of depositing comprising:
depositing a first mass of an ink formulation comprising a carrier and metallic nanostructures dispersed in the carrier on a substrate;
depositing a second mass of the ink formulation comprising the carrier and metallic nanostructure on the substrate, the second mass being spaced apart from the first mass by a gap; and
depositing a reinforcement fiber in the ink formulation in the gap between the first and second masses of metallic nanostructures to form at least one of an electronically conductive bridge and a mechanical interlock between the first and second masses of metallic nanostructures, wherein the depositing of the reinforcement fiber is performed before or after the depositing of the ink formulation.

* * * * *